(12) United States Patent
Liu et al.

(10) Patent No.: US 12,274,127 B2
(45) Date of Patent: Apr. 8, 2025

(54) ARRAY SUBSTRATE AND MANUFACTURING METHOD THEREFOR, DISPLAY PANEL, AND DISPLAY DEVICE

(71) Applicant: BOE TECHNOLOGY GROUP CO., LTD., Beijing (CN)

(72) Inventors: Dongni Liu, Beijing (CN); Minghua Xuan, Beijing (CN); Haoliang Zheng, Beijing (CN); Jiao Zhao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 523 days.

(21) Appl. No.: 17/615,058

(22) PCT Filed: Feb. 24, 2021

(86) PCT No.: PCT/CN2021/077721
§ 371 (c)(1),
(2) Date: Nov. 29, 2021

(87) PCT Pub. No.: WO2021/170005
PCT Pub. Date: Sep. 2, 2021

(65) Prior Publication Data
US 2022/0231105 A1 Jul. 21, 2022

(30) Foreign Application Priority Data
Feb. 28, 2020 (CN) .......................... 202010131149.9

(51) Int. Cl.
*H10K 59/121* (2023.01)
*H10K 59/131* (2023.01)
(Continued)

(52) U.S. Cl.
CPC ..... *H10K 59/1213* (2023.02); *H10K 59/1216* (2023.02); *H10K 59/131* (2023.02); *H10K 59/30* (2023.02); *H10K 59/1201* (2023.02)

(58) Field of Classification Search
CPC .......... H10K 59/1213; H10K 59/1216; H10K 59/131; H10K 59/30; H10K 59/1201;
(Continued)

(56) References Cited
U.S. PATENT DOCUMENTS

2003/0197665 A1* 10/2003 Sung ..................... G09G 3/3233
345/82
2005/0104818 A1* 5/2005 Kwak .................. G09G 3/3233
345/76
(Continued)

FOREIGN PATENT DOCUMENTS
CN 103208253 A 7/2013
CN 203552656 U 4/2014
(Continued)

OTHER PUBLICATIONS

The First Office Action of Priority Application No. CN 202010131149.9 issued by the Chinese Patent Office on Mar. 7, 2022.

*Primary Examiner* — Bitew A Dinke
(74) *Attorney, Agent, or Firm* — XSENSUS LLP

(57) ABSTRACT

An array substrate is configured to carry a plurality of light emitting units with different light emitting colors. The array substrate includes a plurality of pixel driving circuits, a first voltage input line and a second voltage input line. The plurality of pixel driving circuits include at least one first driving circuit and at least one second driving circuit. The first voltage input line is coupled to the at least one first driving circuit, and is configured to transmit a first voltage to the at least one first driving circuit. The second voltage input line is coupled to the at least one second driving circuit, and is configured to transmit a second voltage to the at least one second driving circuit. The first voltage is different from the second voltage.

16 Claims, 8 Drawing Sheets

(51) Int. Cl.
  *H10K 59/30*  (2023.01)
  *H10K 59/12*  (2023.01)
(58) Field of Classification Search
  CPC ...... H10K 59/12; H10K 59/35; G09G 3/3233;
         G09G 3/32; H01L 25/0753; H01L 25/167
  See application file for complete search history.

(56) References Cited

U.S. PATENT DOCUMENTS

| | | | | |
|---|---|---|---|---|
| 2006/0170636 | A1* | 8/2006 | Nakamura | G09G 3/3266 345/92 |
| 2007/0159434 | A1* | 7/2007 | Yen | H05B 45/20 345/92 |
| 2007/0236447 | A1* | 10/2007 | Lee | H05B 45/20 345/102 |
| 2008/0122763 | A1* | 5/2008 | Akimoto | G09G 3/3233 345/82 |
| 2012/0327129 | A1* | 12/2012 | Li | G09G 3/3413 345/83 |
| 2013/0181967 | A1* | 7/2013 | Lee | G09G 3/3258 345/212 |
| 2013/0235013 | A1* | 9/2013 | Chiu | G09G 3/3233 345/211 |
| 2014/0354701 | A1* | 12/2014 | Yeo | G09G 3/3208 345/77 |
| 2015/0109190 | A1* | 4/2015 | Li | G09G 3/3426 345/82 |
| 2015/0123885 | A1* | 5/2015 | Adachi | G09G 3/3208 345/77 |
| 2015/0187859 | A1* | 7/2015 | Choi | G09G 3/3225 257/72 |
| 2015/0302787 | A1 | 10/2015 | Yin | |
| 2015/0332628 | A1* | 11/2015 | Ren | G09G 3/3258 345/83 |
| 2016/0071918 | A1* | 3/2016 | Shishido | G09G 3/3225 257/71 |
| 2016/0314741 | A1* | 10/2016 | Yin | G09G 3/3291 |
| 2017/0011676 | A1* | 1/2017 | Wu | G09G 3/32 |
| 2018/0122286 | A1* | 5/2018 | Wu | G09G 3/32 |
| 2018/0182284 | A1 | 6/2018 | Chung | |
| 2018/0261180 | A1 | 9/2018 | Zhou et al. | |
| 2019/0035333 | A1* | 1/2019 | Chen | G09G 3/3241 |
| 2019/0058151 | A1 | 2/2019 | Zeng et al. | |
| 2020/0051491 | A1* | 2/2020 | Xuan | G09G 3/3233 |
| 2021/0264854 | A1* | 8/2021 | Yamanaka | G09G 3/3225 |
| 2021/0343246 | A1* | 11/2021 | Yin | G09G 3/3291 |
| 2021/0407377 | A1 | 12/2021 | Gao et al. | |
| 2022/0044636 | A1* | 2/2022 | Mou | G09G 3/3258 |

FOREIGN PATENT DOCUMENTS

| | | |
|---|---|---|
| CN | 103971634 A | 8/2014 |
| CN | 104078007 A | 10/2014 |
| CN | 104318903 A | 1/2015 |
| CN | 105513534 A | 4/2016 |
| CN | 107393945 A | 11/2017 |
| CN | 107452783 A | 12/2017 |
| CN | 108109579 A | 6/2018 |
| CN | 108231031 A | 6/2018 |
| CN | 109215600 A | 1/2019 |
| CN | 110148376 A | 8/2019 |
| JP | 2007108247 A | 4/2007 |
| JP | 4797555 B2 | 10/2011 |

\* cited by examiner

Form a plurality of pixel driving circuits including at least one first driving circuit and at least one second driving circuit, the first driving circuit and the second driving circuit being configured to be capable of driving light emitting units with different light emitting colors; the first driving circuit including a first driving transistor, the second driving circuit including a second driving transistor, and a width to length ratio of the first driving transistor being greater than a width to length ratio of the second driving transistor —S11

FIG. 17

ARRAY SUBSTRATE AND MANUFACTURING METHOD THEREFOR, DISPLAY PANEL, AND DISPLAY DEVICE

CROSS-REFERENCE TO RELATED APPLICATIONS

This application is a national phase entry under 35 USC 371 of International Patent Application No. PCT/CN2021/077721 filed on Feb. 24, 2021, which claims priority to Chinese Patent Application No. 202010131149.9, filed on Feb. 28, 2020, which are incorporated herein by reference in their entirety.

TECHNICAL FIELD

The present disclosure relates to the field of display technologies, and in particular, to an array substrate and a manufacturing method therefor, a display panel, and a display device.

BACKGROUND

An ultra light emitting diode (μLED) may be a micro light emitting diode (Micro LED) or a mini light emitting diode (Mini LED), or the like. μLEDs are integrated on an array substrate at a high density, and each μLED may be addressed and emit light individually.

SUMMARY

In an aspect, an array substrate is provided. The array substrate is configured to be capable of carrying a plurality of light emitting units with different light emitting colors. The array substrate includes a plurality of pixel driving circuits, a first voltage input line and a second voltage input line. The plurality of pixel driving circuits include at least one first driving circuit and at least one second driving circuit, and a first driving circuit in the at least one first driving circuit and a second driving circuit in the at least one second driving circuit are configured to drive light emitting units with different light emitting colors. The first voltage input line is coupled to the at least one first driving circuit, and is configured to transmit a first voltage to the at least one first driving circuit. The second voltage input line is coupled to the at least one second driving circuit, and is configured to transmit a second voltage to the at least one second driving circuit. The first voltage is different from the second voltage.

In some embodiments, each light emitting unit has a first electrode and a second electrode, and the first driving circuit and the second driving circuit are respectively coupled to first electrodes of the light emitting units with different light emitting colors. The array substrate further includes a common voltage input line synchronously coupled to second electrodes of the plurality of light emitting units with different light emitting colors and configured to transmit a set voltage to the second electrodes of the plurality of light emitting units with different light emitting colors.

In some embodiments, the plurality of light emitting units include at least one red light emitting unit, at least one green light emitting unit and at least one blue light emitting unit. The first driving circuit is configured to drive a red light emitting unit in the at least one red light emitting unit, and the second driving circuit is configured to drive a green light emitting unit in the at least one green light emitting unit or a blue light emitting unit in the at least one blue light emitting unit. A voltage difference between the first voltage and the set voltage is greater than a voltage difference between the second voltage and the set voltage.

In some embodiments, the first driving circuit includes a first driving transistor, and the second driving circuit includes a second driving transistor. A width to length ratio of the first driving transistor is greater than a width to length ratio of the second driving transistor.

In some embodiments, the first driving circuit further includes a first switching transistor, and the second driving circuit further includes a second switching transistor. A width to length ratio of the first switching transistor is greater than a width to length ratio of the second switching transistor.

In some embodiments, the plurality of pixel driving circuits further include at least one third driving circuit. The array substrate further includes a third voltage input line coupled to the at least one third driving circuit and configured to transmit a third voltage to the at least one third driving circuit. The third voltage is different from both the first voltage and the second voltage.

In some embodiments, the plurality of light emitting units include at least one red light emitting unit, at least one green light emitting unit and at least one blue light emitting unit. The first driving circuit is coupled to a first electrode of a red light emitting unit in the at least one red light emitting unit, and is configured to drive the red light emitting unit. The second driving circuit is coupled to a first electrode of a green light emitting unit in the at least one green light emitting unit, and is configured to drive the green light emitting unit. The third driving circuit is coupled to a first electrode of a blue light emitting unit in the at least one blue light emitting unit, and is configured to drive the blue light emitting unit. A voltage difference between the first voltage and the set voltage is greater than a voltage difference between the second voltage and the set voltage, and the voltage difference between the second voltage and the set voltage is greater than a voltage difference between the third voltage and the set voltage.

In some embodiments, the first driving circuit includes a first driving transistor, the second driving circuit includes a second driving transistor, and the third driving circuit includes a third driving transistor. A width to length ratio of the first driving transistor is greater than a width to length ratio of the second driving transistor, and the width to length ratio of the second driving transistor is greater than a width to length ratio of the third driving transistor.

In some embodiments, the first driving circuit further includes a first switching transistor, the second driving circuit further includes a second switching transistor, and the third driving circuit further includes a third switching transistor. A width to length ratio of the first switching transistor is greater than a width to length ratio of the second switching transistor, and the width to length ratio of the second switching transistor is greater than a width to length ratio of the third switching transistor.

In some embodiments, a light emitting unit in the plurality of light emitting units is a micro light emitting diode or a sub-millimeter light emitting diode.

In another aspect, another array substrate is provided. The array substrate is configured to be capable of carrying a plurality of light emitting units with different light emitting colors. The array substrate includes a plurality of pixel driving circuits. The plurality of pixel driving circuits include at least one first driving circuit and at least one second driving circuit, and a first driving circuit in the at least one first driving circuit and a second driving circuit in the at least one second driving circuit are configured to drive light emitting units with different light emitting colors. The first driving circuit includes a first driving transistor, and the second driving circuit includes a second driving transistor. A width to length ratio of the first driving transistor is greater than a width to length ratio of the second driving transistor.

In some embodiments, the plurality of light emitting units include at least one red light emitting unit, at least one green light emitting unit and at least one blue light emitting unit. The first driving circuit is configured to drive a red light emitting unit in the at least one red light emitting unit, and the second driving circuit is configured to drive a green light emitting unit in the at least one green light emitting unit or a blue light emitting unit in the at least one blue light emitting unit.

In some embodiments, the plurality of pixel driving circuits further include at least one third driving circuit, a third driving circuit in the at least one third driving circuit is configured to drive the blue light emitting unit, and the second driving circuit is configured to drive the green light emitting unit. The third driving circuit includes a third driving transistor, and a width to length ratio of the third driving transistor is less than the width to length ratio of the second driving transistor.

In yet another aspect, a display panel is provided. The display panel includes the array substrate and the plurality of light emitting units with different light emitting colors disposed on the array substrate according to any one of the above embodiments.

In yet another aspect, a display device is provided. The display device includes the display panel according to any one of the above embodiments.

In yet another aspect, a manufacturing method of an array substrate is provided. The manufacturing method includes: forming a plurality of pixel driving circuits including at least one first driving circuit and at least one second driving circuit, a first driving circuit in the at least one first driving circuit and a second driving circuit in the at least one second driving circuit being configured to drive light emitting units with different light emitting colors; forming a first voltage input line coupled to the at least one first driving circuit and configured to transmit a first voltage to the at least one first driving circuit; and forming a second voltage input line coupled to the at least one second driving circuit and configured to transmit a second voltage to the at least one second driving circuit. The first voltage is different from the second voltage.

In yet another aspect, a manufacturing method of another array substrate is provided. The manufacturing method includes: forming a plurality of pixel driving circuits including at least one first driving circuit and at least one second driving circuit. A first driving circuit in the at least one first driving circuit and a second driving circuit in the at least one second driving circuit are configured to be capable of driving light emitting units with different light emitting colors. The first driving circuit includes a first driving transistor, the second driving circuit includes a second driving transistor, and a width to length ratio of the first driving transistor is greater than a width to length ratio of the second driving transistor.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

FIG. 17 is a flow diagram of another manufacturing method of an array substrate according to some embodiments.

DETAILED DESCRIPTION

Figure 1:
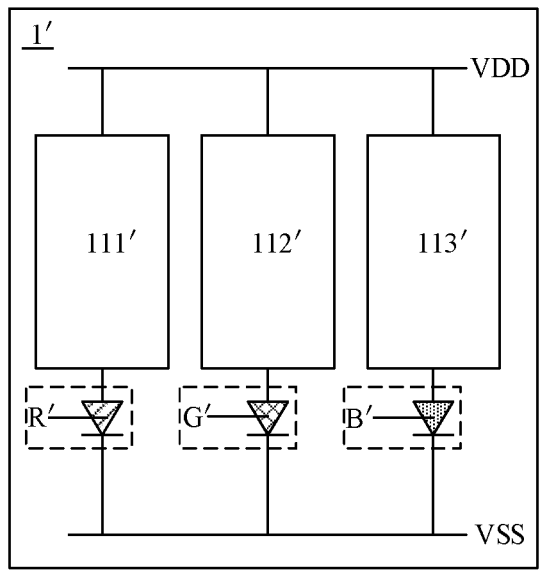
FIG. 1 is a structural diagram of an array substrate according to the related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "coupled" and derivatives thereof may be used. For example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

In addition, the use of the phrase "based on" is meant to be open and inclusive, in that a process, step, calculation or other action that is "based on" one or more of the stated conditions or values may, in practice, be based on additional conditions or values exceeding those stated.

The term "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Therefore, variations in shapes with respect to the drawings due to, for example, manufacturing techniques and/or tolerances may be conceivable. Therefore, the exemplary embodiments should not be construed to be limited to the shapes of the regions shown herein, but to include the deviations in shapes due to, for example, manufacturing. For example, an etched region that is shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Light emitting units with different light emitting colors in an organic light emitting diode (OLED) display device have a driving current of tens of nanoamperes (nA), and light emitting units (i.e., μLED chips) with different light emitting colors in a μLED (e.g., Micro LED or Mini LED) display device have a driving current that may reach tens of microamperes (μA) to hundreds of μA, which is thousands of times the magnitude of the driving current of nA level in the OLED display device. Therefore, a μLED product has a problem of high power consumption.

In addition, it is noticed that since the μLED chips with different light emitting colors have different luminous efficiencies, and the μLED chips also have different starting voltages, in a gray scale display state of a pixel unit, μLED chips in the pixel unit have different driving currents. The pixel unit may, for example, include a red μLED chip, a green μLED chip and a blue μLED chip.

In the related art, as shown in FIG. 1, an array substrate 1' in the μLED display device includes a pixel driving circuit 111' for driving a red light emitting unit R', a pixel driving circuit 112' for driving a green light emitting unit G' and a pixel driving circuit 113' for driving a blue light emitting unit B', and these pixel driving circuits are connected to a same anode voltage input line VDD and a same cathode voltage input line VSS. Generally, these pixel driving circuits for driving the light emitting units with different light emitting colors have a same structure.

The μLED chips with different light emitting colors have different luminous efficiencies and starting voltages. In order to meet requirements of a display device regarding luminance and white balance, μLED chips with different light emitting colors in a same display device require different maximum driving currents when displaying a maximum gray scale. For example, in order to realize the white balance, a required luminance of red light is large, but a luminous efficiency of the red μLED chip is lowest, which results in that a maximum driving current (a driving current corresponding to a maximum luminous power) of the red μLED chip is greater than maximum driving currents of the blue μLED chip and the green μLED chip. When a voltage difference between the anode voltage input line VDD and the cathode voltage input line VSS is able to meet a requirement for driving the red μLED chip, for the blue μLED chip (or the green μLED chip), the voltage difference between the anode voltage input line VDD and the cathode voltage input line VSS is greater than an actual voltage required by the pixel driving circuit corresponding to the blue μLED chip (or the green μLED chip), and an excess voltage is consumed by corresponding components (e.g., driving transistors or switching transistors) of the pixel driving circuit, thereby increasing non-luminous power consumption of the display device.

Figure 2:
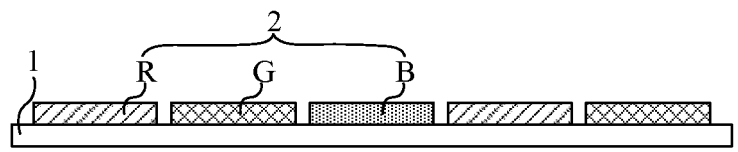
FIG. 2 is a side view of an array substrate carrying light emitting units according to some embodiments.
Figure 3:
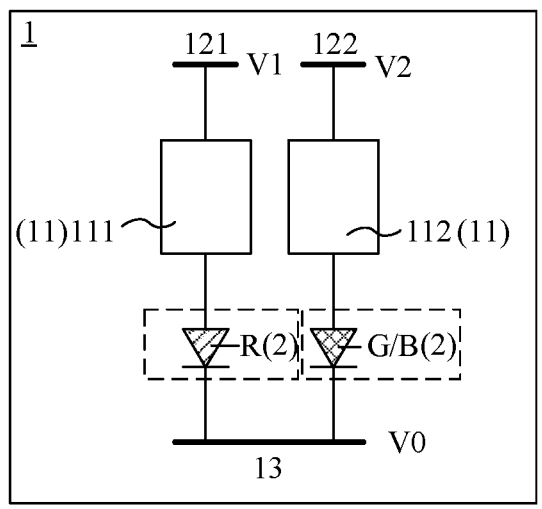
FIG. 3 is a top view of an array substrate according to some embodiments.

Based on this, some embodiments of the present disclosure provide an array substrate 1. As shown in FIGS. 2 and 3, the array substrate 1 is configured to be capable of carrying a plurality of light emitting units 2 with different light emitting colors. The array substrate 1 includes a plurality of pixel driving circuits 11, a first voltage input line 121 and a second voltage input line 122.

The light emitting unit 2 may be a micro light emitting diode (i.e., Micro LED) or a sub-millimeter light emitting diode (i.e., Mini LED).

The plurality of pixel driving circuits 11 include at least one first driving circuit 111 and at least one second driving circuit 112. The first driving circuit 111 and the second driving circuit 112 are configured to drive light emitting units 2 with different light emitting colors, respectively. For example, the first driving circuit 111 and the second driving circuit 112 have a same structure.

The first voltage input line 121 is coupled to the at least one first driving circuit 111, and is configured to transmit a first voltage V1 to the at least one first driving circuit 111. The second voltage input line 122 is coupled to the at least one second driving circuit 112, and is configured to transmit a second voltage V2 to the at least one second driving circuit 112.

In some examples, as shown in FIG. 3, each light emitting unit 2 has a first electrode and a second electrode, and the first driving circuit 111 and the second driving circuit 112 are respectively coupled to the first electrodes of the light emitting units 2 with different light emitting colors. The array substrate 1 further includes a common voltage input line 13, and the common voltage input line 13 is coupled to the second electrodes of the plurality of light emitting units 2 with different light emitting colors. The common voltage input line 13 is configured to transmit a set voltage V0 to the second electrodes of the plurality of light emitting units 2 with different light emitting colors. In this way, the common voltage input line 13 may transmit the same set voltage V0 to the plurality of light emitting units 2 coupled thereto.

In the array substrate 1 in some embodiments of the present disclosure, since a voltage signal (i.e., the first voltage V1) provided by the first voltage input line 121 to the first driving circuit 111 is different from a voltage signal (i.e., the second voltage V2) provided by the second voltage input line 122 to the second driving circuit 112, and the common voltage input line 13 provides a same voltage signal (i.e., the set voltage V0) to the second electrodes of the light emitting units 2 with different light emitting colors, an overall voltage, across the first driving circuit 111 and the light emitting unit 2 corresponding to the first driving circuit 111, provided by the first voltage input line 121 and the common voltage input line 13 is different from an overall voltage, across the second driving circuit 112 and the light emitting unit 2 corresponding to the second driving circuit 112, provided by the second voltage input line 122 and the common voltage input line 13. Therefore, different voltages are able to be provided according to requirements for driving the light emitting units 2 with different light emitting colors, so that the light emitting unit 2 which requires a small driving current and the pixel driving circuit 11 corresponding thereto may overall receive a small voltage. Also, in a case of realizing the white balance, the light emitting unit 2 with a small driving current has an unchanged driving current, and the pixel driving circuit 11 corresponding to the light emitting unit 2 has a voltage that is consistent with an actual voltage required. Therefore, an ineffective power consumption of a non-luminous portion in the pixel driving circuit 11 may be reduced, thereby reducing the power consumption of the array substrate 1.

In some examples, the light emitting unit 2 is a light emitting diode. For example, the first electrode of the light emitting unit 2 is an anode of the light emitting diode, and the second electrode is a cathode of the light emitting diode. Alternatively, the first electrode of the light emitting unit 2 is the cathode of the light emitting diode, and the second electrode is the anode of the light emitting diode.

In some examples, each of the first voltage input line 121 and the second voltage input line 122 is an anode voltage input line, and in this case, the common voltage input line 13 is a cathode voltage input line. In some other examples, each of the first voltage input line 121 and the second voltage input line 122 is a cathode voltage input line, and in this case, the common voltage input line 13 is an anode voltage input line.

For example, the anode of the light emitting diode corresponds to the anode voltage input line, and the cathode of the light emitting diode corresponds to the cathode voltage input line.

In this way, by using an independent driving mode of an anode power supply (that is, each of the first voltage input line 121 and the second voltage input line 122 is the anode voltage input line, and the common voltage input line 13 is the cathode voltage input line) or an independent driving mode of a cathode power supply (that is, each of the first voltage input line 121 and the second voltage input line 122 is the cathode voltage input line, and the common voltage input line 13 is the anode voltage input line), a voltage across the first driving circuit 111 may be different from a voltage across the second driving circuit 112, so that the voltage across the pixel driving circuit 11 corresponding to the light emitting unit 2 which requires a small driving current is reduced, thereby reducing the power consumption of the array substrate 1 in the case of achieving the white balance.

Figure 4:
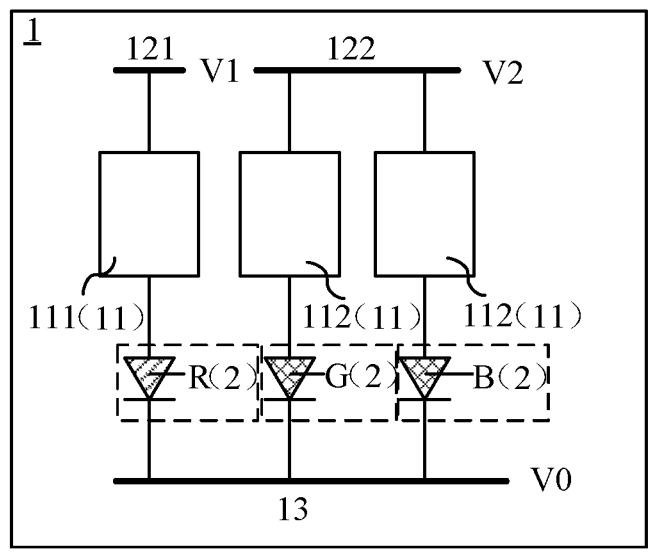
FIG. 4 is a top view of another array substrate according to some embodiments.

In some embodiments of the present disclosure, as shown in FIG. 4, the plurality of light emitting units 2 include at least one red light emitting unit R, at least one green light emitting unit G, and at least one blue light emitting unit B. The first driving circuit 111 is configured to drive the red light emitting unit R, and the second driving circuit 112 is configured to drive the green light emitting unit G or the blue light emitting unit B. A voltage difference between the first voltage V1 and the set voltage V0 is greater than a voltage difference between the second voltage V2 and the set voltage V0.

For the μLED display device, a maximum driving current of the red light emitting unit R is large, and even more than twice a maximum driving current of the green light emitting unit G, so that the maximum driving currents of the two have a significant difference therebetween. Therefore, by using the independent driving mode of the anode power supply or the independent driving mode of the cathode power supply, a voltage across the first driving circuit 111 and a voltage across the second driving circuit 112 may be different, so as to respectively meet a requirement of the first driving circuit 111 to drive the red light emitting unit R and a requirement of the second driving circuit 112 to drive the green light emitting unit G, thereby avoiding a large ineffective power consumption of the array substrate 1 due to a case that both the first driving circuit 111 and the second driving circuit 112 have a voltage corresponding to a requirement for driving the red light emitting unit R, and reducing the power consumption of the array substrate 1.

In addition, since a difference between maximum driving currents of the green light emitting unit G and the blue light emitting unit B is small, and the difference between the maximum driving currents of the green light emitting unit G and the blue light emitting unit B is much less than the difference between the maximum driving currents of the green light emitting unit G and the red light emitting unit R, the green light emitting unit G and the blue light emitting unit B may use the second driving circuits 112 with a same voltage, which does not significantly increase the power consumption of the array substrate 1. Moreover, the second driving circuits 112 corresponding to the green light emitting unit G and the blue light emitting unit B are coupled to the same second voltage input line 122, so that the second voltage V2 may be transmitted to the second driving circuit 112 for driving the green light emitting unit G and the second driving circuit 112 for driving the blue light emitting unit B, thereby reducing the number of second voltage input lines 122 used, and reducing a load of a driving chip.

Figure 5:
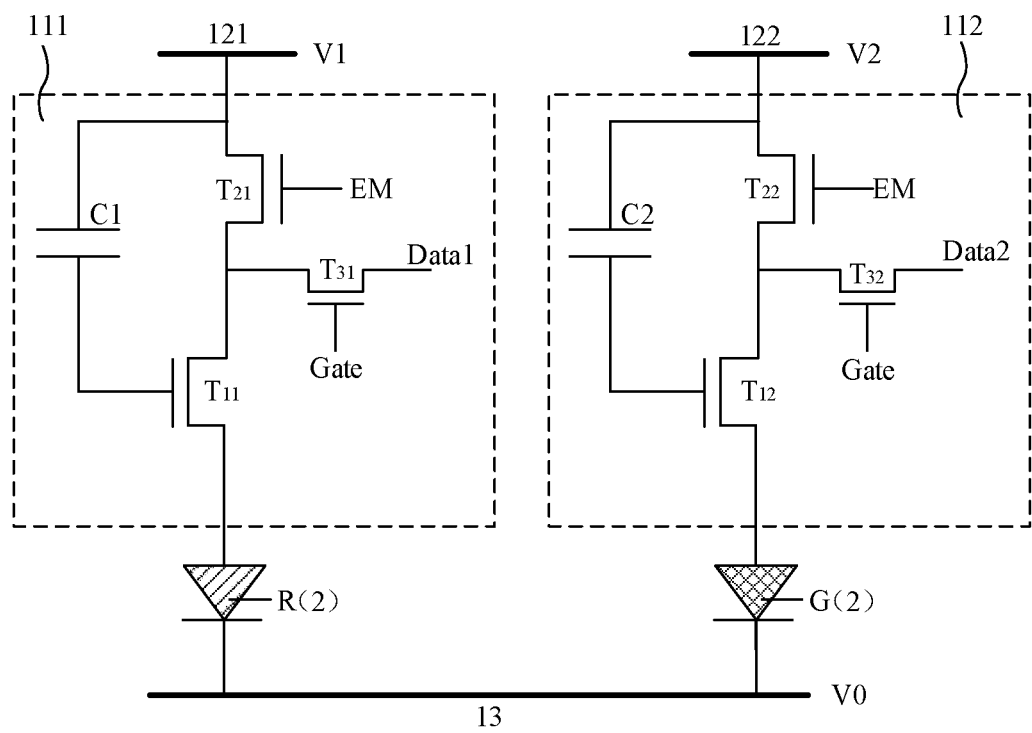
FIG. 5 is a structural diagram of a pixel driving circuit according to some embodiments.

It will be noted that each pixel driving circuit 11 has a driving transistor. As shown in FIG. 5, in some examples, the first driving circuit 111 includes a first driving transistor T11, and the second driving circuit 112 includes a second driving transistor T12.

In the array substrate 1 in some embodiments of the present disclosure, the light emitting units 2 with different light emitting colors are driven by the pixel driving circuits 11 with different voltages, and a power of the array substrate 1 is a product of a power of each pixel unit and the number of pixel units. In an example where each pixel unit includes a red light emitting unit R, a green light emitting unit G and a blue light emitting unit B, and has a resolution of M×N, the power of the array substrate 1 is:

$$P = P0 \cdot M \cdot N = (P_R + P_G + P_B) \cdot M \cdot N = [(V_{ds-R} + K) \cdot I_R + (V_{ds-G} + K) \cdot I_G + (V_{ds-B} + K) \cdot I_B] \cdot M \cdot N.$$

However, in the related art, the light emitting units with different light emitting colors in the array substrate 1' are driven by the pixel driving circuits with a same voltage. As shown in FIG. 1, in an example where each pixel unit includes a red light emitting unit R', a green light emitting unit G' and a blue light emitting unit B', and has a resolution of M×N, a power of the array substrate 1' in the related art is:

$$P' = P0' \cdot M \cdot N = (P_{R'} + P_{G'} + P_{B'}) \cdot M \cdot N = [(V_{ds-R'} + K) \cdot I_{R'} + (V_{ds-R'} + K) \cdot I_{G'} + (V_{ds-R'} + K) \cdot I_{B'}] \cdot M \cdot N.$$

In the above two formulas, P is the power of the array substrate 1 in some embodiments of the present disclosure, P0 is the power of each pixel unit in some embodiments of the present disclosure, $P_R$ is a power of the red light emitting unit R in some embodiments of the present disclosure, $P_G$ is a power of the green light emitting unit G in some embodiments of the present disclosure, and $P_B$ is a power of the blue light emitting unit B in some embodiments of the present disclosure.

P' is the power of the array substrate 1' in the related art, P0' is a power of each pixel unit in the related art, $P_{R'}$ is a power of the red light emitting unit R' in the related art, $P_{G'}$ is a power of the green light emitting unit G' in the related art, and $P_{B'}$ is a power of the blue light emitting unit B' in the related art.

$V_{ds-R}$ is a voltage across a driving transistor for driving the red light emitting unit R, $V_{ds-G}$ is a voltage across a driving transistor for driving the green light emitting unit G, $V_{ds-B}$ is a voltage across a driving transistor for driving the blue light emitting unit B, $V_{ds-R'}$ is a voltage across a driving transistor for driving the red light emitting unit R', K is a voltage drop (including a voltage drop of an anode voltage input line and a voltage drop of a cathode voltage input line) in each driving circuit, $I_R$ is a driving current of the red light emitting unit R, $I_G$ is a driving current of the green light emitting unit G, and $I_B$ is a driving current of the blue light emitting unit B, $I_{R'}$ is a driving current of the red light emitting unit R', $I_{G'}$ is a driving current of the green light emitting unit G', and $I_{B'}$ is a driving current of the blue light emitting unit B'.

For the array substrate 1 in some embodiments of the present disclosure, since the voltage across the first driving circuit 111 for driving the red light emitting unit R is greater than the voltage across the second driving circuit 112 for driving the green light emitting unit G (or the blue light emitting unit B), and the voltage across the second driving circuit 112 for driving the green light emitting unit G is the same as the voltage across the second driving circuit 112 for driving the blue light emitting unit B, a voltage across the first driving transistor T11 in the first driving circuit 111 is greater than a voltage across the second driving transistor T12 in the second driving circuit 112, i.e., $V_{ds-R} > V_{ds-G} = V_{ds-B}$.

For the array substrate 1' in the related art, in order to meet a requirement for driving the red light emitting unit R', the pixel driving circuits for the green light emitting unit G' and the blue light emitting unit B' have the same voltage as the pixel driving circuit for the red light emitting unit R', so that the voltage across the driving transistor corresponding to each light emitting unit is $V_{ds-R}$.

Therefore, in a case where the array substrate 1 in some embodiments of the present disclosure and the array substrate 1' in the related art are required to display a same screen, i.e., the driving currents (i.e., $I_R$, $I_G$, and $I_B$) of the light emitting units with different light emitting colors are the same, since the voltages across the driving transistors corresponding to the blue light emitting unit B and the green light emitting unit G are reduced in the array substrate 1 in some embodiments of the present disclosure, the power of the array substrate 1 in some embodiments of the present disclosure is less than the power of the array substrate 1' in the related art. That is, the power consumption of the array substrate 1 is reduced.

In some embodiments, a width to length ratio of the first driving transistor T11 is equal to that of the second driving transistor T12. In this way, a layout arrangement of the pixel driving circuits 11 may be simple.

In some other embodiments, the width to length ratio of the first driving transistor T11 is greater than that of the second driving transistor T12. For example, the width to length ratio of the first driving transistor T11 is W1/L1, and the width to length ratio of the second driving transistor T12 is W2/L2. For example, the width to length ratio of the first driving transistor T11 may be greater than that of the second driving transistor T12 by making W1 equal to W2 (i.e., W1=W2) and L1 less than L2 (i.e., L1<L2). For another example, the width to length ratio of the first driving transistor T11 may also be greater than that of the second driving transistor T12 by making W1 greater than W2 (i.e., W1>W2) and L1 equal to L2 (i.e., L1=L2).

The μLED chip is a current driven device, and a driving current of a certain light emitting unit in the μLED display device is:

$$I = \frac{\mu}{2} \cdot C \cdot \frac{W}{L} \cdot (V_{gs} - V_{th})^2.$$

Where I is the driving current of the light emitting unit, μ is an electron mobility, C is a capacitance of gate oxide (i.e., a capacitance from a gate to a base) per unit area, W and L are a width and a length of a channel, respectively, $V_{gs}$ is a gate-source voltage, and $V_{th}$ is a threshold voltage.

In addition, $$V_{gs} = V_{data} - VDD.$$

Where $V_{data}$ is a data voltage.

Since the driving current of the red light emitting unit R is greater than that of the green light emitting unit G and that of the blue light emitting unit B, the following description is made in an example where the second driving circuit drives the green light emitting unit G, so as to avoid redundant explanation.

For the red light emitting unit R, it can be seen from the above formula that in a case where the width to length ratio (W/L) of the first driving transistor T11 for driving the red light emitting unit R is the same as the width to length ratio (W/L) of the second driving transistor T12 for driving the green light emitting unit G, and in a case where p and C are unchanged, since the driving current of the red light emitting unit R is larger than that of the green light emitting unit G, $(V_{gs}-V_{th})^2$ of the first driving transistor T11 is relatively large. Moreover, $V_{th}$ is unchanged, so that an adjustment range of $V_{gs}$ is relatively large, and thus, an adjustment range of $V_{data}$ is also relatively large. In this way, a luminance adjustment fineness of the red light emitting unit R is lower than that of the green light emitting unit G.

For the green light emitting unit G, it can be seen from the above formula that in a case where μ, C, and I are unchanged, a decrease of W/L may make $(V_{gs}-V_{th})^2$ increase. Moreover, $V_{th}$ is unchanged, so that an adjustment range of $V_{gs}$ is increased, and thus, an adjustment range of $V_{data}$ is also increased. It can be seen from this that in the case where μ, C, and I are unchanged, and in a case where the width to length ratio of the second driving transistor T12 for driving the green light emitting unit G is less than the width to length ratio of the first driving transistor T11 for driving the red light emitting unit R, the adjustment range of $V_{data}$ of the green light emitting unit G may be relatively increased, so as to reduce the luminance adjustment fineness of the green light emitting unit G, thereby reducing the manufacturing difficulty of the driving chip.

Figure 6:
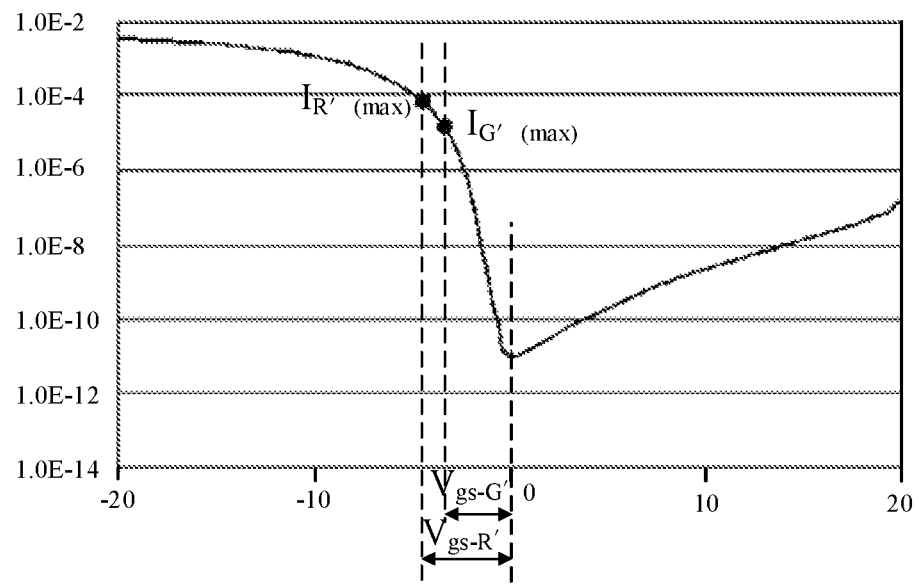
FIG. 6 is a graph showing characteristics of a driving transistor for driving a red light emitting unit and a driving transistor for driving a green light emitting unit when driving transistors of a same size are used in the related art.

On another hand, referring to FIG. 6, FIG. 6 shows a characteristic curve (i.e., $V_{gs}$-I) between a gate-source voltage and a driving current of a used driving transistor in a case where the light emitting units (e.g., the red light emitting unit R' and the green light emitting unit G') with different light emitting colors in the related art are driven to emit light by the driving transistors of the same size (i.e., the same width to length ratio). The abscissa is the gate-source voltage of the driving transistor in volts (V), and the ordinate is the driving current of the driving transistor in amperes (A). Since the driving transistors of the same size are used, the driving transistors corresponding to the light emitting units with different light emitting colors have a same cut-off voltage (as shown in FIG. 6, the cut-off voltage is approximately 0 V). Since a maximum driving current $I_{R'(max)}$ of the red light emitting unit R' is greater than a maximum driving current $I_{G'(max)}$ of the green light emitting unit G', an adjustment range of a gate-source voltage $V_{gs\text{-}G'}$ of the driving transistor in the green light emitting unit G' is less than an adjustment range of a gate-source voltage $V_{gs\text{-}R'}$ of the driving transistor in the red light emitting unit R'. Moreover, $V_{gs}=V_{data}-VDD$, and in a case where VDD is unchanged, an adjustment range of a data signal (i.e., $V_{data}$) of the green light emitting unit G' is less than an adjustment range of a data signal of the red light emitting unit R'. Since a driving transistor with a larger requirement for an adjustment range of a gate-source voltage requires a larger adjustment range of a data signal of a driven light emitting unit, in the case where the driving transistor for driving the green light emitting unit G' has the same size as the driving transistor for driving the red light emitting unit R', an adjustment accuracy required for the data signal of the green light emitting unit G' is relatively high, which increases the manufacturing difficulty of the driving chip, and easily limits a gray scale display range of the green light emitting unit.

Figure 7:
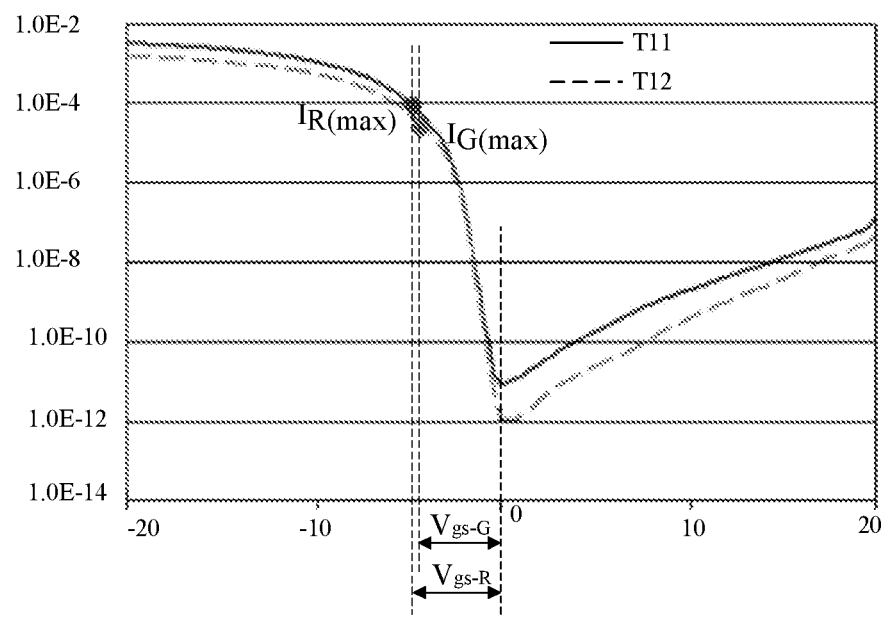
FIG. 7 is a graph showing characteristics of a driving transistor for driving a red light emitting unit and a driving transistor for driving a green light emitting unit when driving transistors of different sizes are used according to some embodiments.

Referring to FIG. 7, FIG. 7 shows characteristic curves (i.e., $V_{gs}$-I) between agate-source voltages and driving currents of used driving transistors in a case where the width to length ratio of the first driving transistor T11 for driving the red light emitting unit R is greater than that of the second driving transistor T12 for driving the green light emitting unit G in some embodiments of the present disclosure. There is a significant difference between the $V_{gs}$-I characteristic curve of the first driving transistor T11 and the $V_{gs}$-I characteristic curve of the second driving transistor T12 in FIG. 7. The first driving transistor T11 and the second driving transistor T12 have approximately the same cut-off voltage. However, due to the same gate-source voltage, a driving current $I_{R(max)}$ of the first driving transistor T11 is greater than a driving current $I_{G(max)}$ of the second driving transistor T12. Therefore, in a case where the maximum driving current of the green light emitting unit G is unchanged, the adjustment range of the gate-source voltage of the second driving transistor T12 is able to be increased by adjusting the width to length ratios of the first driving transistor T11 and the second driving transistor T12. That is, the adjustment range of the data signal of the green light emitting unit G is able to be increased, and thus the luminance adjustment fineness of the green light emitting unit G is reduced, thereby reducing the manufacturing difficulty of the driving chip.

Figure 8:
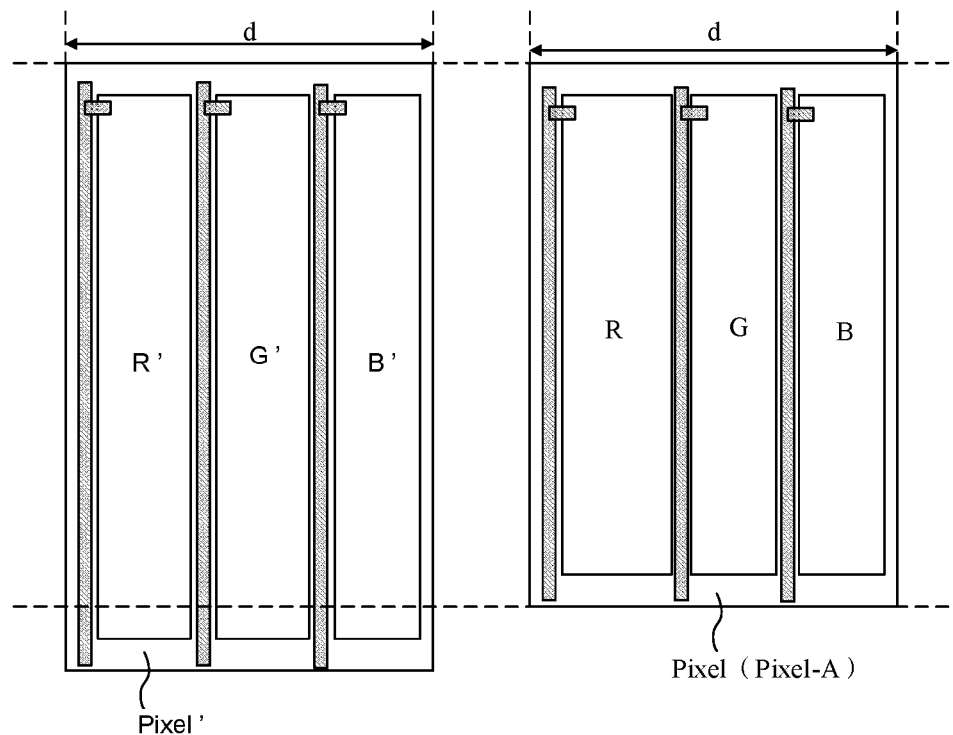
FIG. 8 is a comparison diagram of a pixel layout design in the related art and a pixel layout design in some embodiments of the present disclosure.

As shown in FIG. 8, the left side of FIG. 8 shows a pixel layout design in the case where the sizes of the driving transistors corresponding to each pixel unit Pixel' (e.g., including the red light emitting unit R', the green light emitting unit G' and the blue light emitting unit B') in the array substrate 1' in the related art are the same. The right side of FIG. 8 shows a pixel layout design in the case where the sizes of the driving transistors corresponding to each pixel unit Pixel (e.g., including the red light emitting unit R, the green light emitting unit G and the blue light emitting unit B) in the array substrate 1 in some embodiments of the present disclosure are different. In the array substrate 1 in some embodiments of the present disclosure, the width to length ratio of the first driving transistor T11 is greater than that of the second driving transistor T12. That is, the width to length ratio of the driving transistor in the red light emitting unit R with a relatively large driving current is relatively large, so that a required arrangement space is also relatively large. The width to length ratio of the driving transistor corresponding to the green light emitting unit G (or the blue light emitting unit B) with a relatively small driving current is relatively small, so that an arrangement space required by the pixel unit Pixel is also relatively small, which may therefore reduce a pixel layout design space required by each pixel unit Pixel compared with the case that the driving transistors of the same size are used in each pixel unit Pixel' in the related art, thereby improving a resolution of a product. Moreover, according to the above, in the case where the driving transistors with different width to length ratios are used, for example, in a case where the width to length ratio of the driving transistor for driving the green light emitting unit G or the blue light emitting unit B is less than that of the driving transistor for driving the red light emitting unit R, the adjustment range of the data signal of the light emitting unit (e.g., the green light emitting unit G or the blue light emitting unit B) with a small driving current is able to be increased, which is beneficial for the display device to realize display of more gray scales while reducing the manufacturing difficulty of the driving chip.

In some examples, as shown in FIG. 8, in the case where the driving transistors with the same width to length ratio are used in the related art, for example, a space required by the pixel unit Pixel' (including the pixel driving circuit for driving the red light emitting unit, the pixel driving circuit for driving the green light emitting unit, and the pixel driving circuit for driving the blue light emitting unit) is 250 μm×500 μm. However, in the case where the driving transistors with different width to length ratios are used in some embodiments of the present disclosure, a space required by the pixel unit Pixel (including the first driving circuit 111 and two second driving circuits 112) is 250 μm×440 μm. It can be seen from this that the pixel layout design space required by each pixel unit may be greatly reduced, and thus the resolution of the display device is able to be significantly improved.

It will be noted that even if a voltage across the first driving circuit 111 is the same as a voltage across the second driving circuit 112, and only the width to length ratio of the first driving transistor T11 is greater than that of the second driving transistor T12, the pixel layout design space required by each pixel unit is able to be reduced, and the adjustment range of the data signal of the light emitting unit with a small driving current (e.g., the green light emitting unit G or the blue light emitting unit B) is increased, which reduces the manufacturing difficulty of the driving chip, and is beneficial for the display device to realize display of more gray scales.

For the array substrate 1 in some embodiments of the present disclosure, for example, referring to FIG. 5, the first driving circuit 111 further includes a first switching transistor T21, and the second driving circuit 112 further includes a second switching transistor T22. A width to length ratio of the first switching transistor T21 is greater than that of the second switching transistor T22.

In some examples, the width to length ratio of the first switching transistor T21 is the same as that of the first driving transistor T11, and the width to length ratio of the second switching transistor T22 is the same as that of the second driving transistor T12, which is able to reduce the manufacturing difficulty of the array substrate 1.

In some examples, as shown in FIG. 5, the first driving circuit 111 further includes a first storage capacitor C1 and a first data writing transistor T31, and the second driving circuit 112 further includes a second storage capacitor C2 and a second data writing transistor T32. The first storage capacitor C1 and the second storage capacitor C2 may have a same size. Alternatively, the sizes of the first storage capacitor C1 and the second storage capacitor C2 may be adjusted according to the design of the pixel driving circuits 11. The first data writing transistor T31 and the second data writing transistor T32 may have a same width to length ratio to facilitate the adjustment of the data signal by the driving chip.

For example, each of the first driving circuit 111 and the second driving circuit 112 may further include a device such as a reset transistor, and there may be a plurality of switching transistors. That is, specific circuits of the first driving circuit 111 and the second driving circuit 112 may be adjusted according to implementation conditions.

Figure 9:
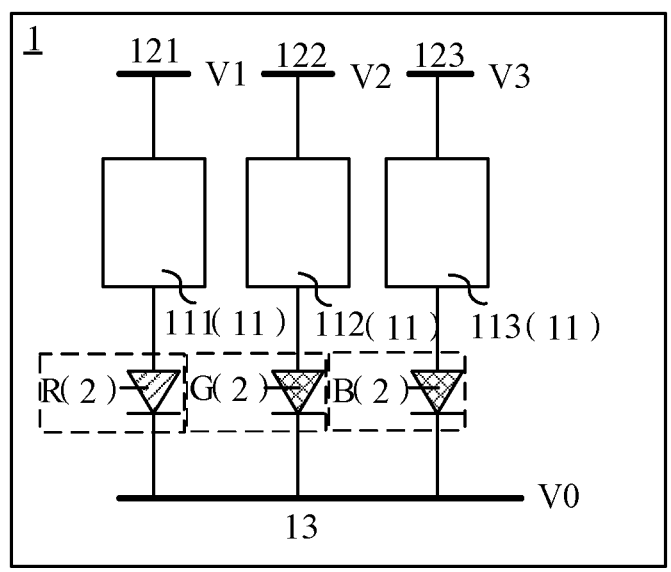
FIG. 9 is a top view of yet another array substrate according to some embodiments.

In some embodiments, as shown in FIG. 9, the plurality of pixel driving circuits 11 further include at least one third driving circuit 113, and the array substrate 1 further includes a third voltage input line 123 coupled to the at least one third driving circuit 113. The third voltage input line 123 is configured to transmit a third voltage V3 to the at least one third driving circuit 113, and the third voltage V3 is different from both the first voltage V1 and the second voltage V2.

In some examples, as shown in FIG. 9, the light emitting unit includes the red light emitting unit R, the green light emitting unit G, and the blue light emitting unit B. The first driving circuit 111 is coupled to the first electrode of the red light emitting unit R, and is configured to drive the red light emitting unit R. The second driving circuit 112 is coupled to the first electrode of the green light emitting unit G, and is configured to drive the green light emitting unit G. The third driving circuit 113 is coupled to the first electrode of the blue light emitting unit B, and is configured to drive the blue light emitting unit B. The voltage difference between the first voltage V1 and the set voltage V0 is greater than the voltage difference between the second voltage V2 and the set voltage V0, and the voltage difference between the second voltage V2 and the set voltage V0 is greater than a voltage difference between the third voltage V3 and the set voltage V0.

Figure 10:
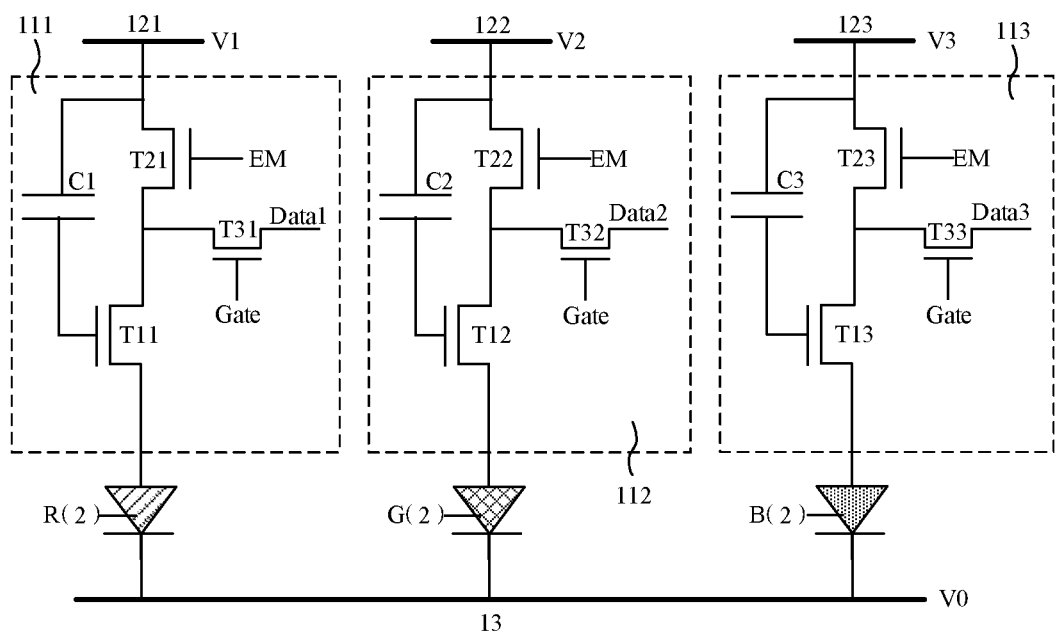
FIG. 10 is a structural diagram of another pixel driving circuit according to some embodiments.

In some examples, as shown in FIG. 10, the first driving circuit 111 includes the first driving transistor T11, the second driving circuit 112 includes the second driving transistor T12, and the third driving circuit 113 includes a third driving transistor T13. The width to length ratio of the first driving transistor T11 is greater than that of the second driving transistor T12, and the width to length ratio of the second driving transistor T12 is greater than that of the third driving transistor T13.

Since the driving current of the red light emitting unit R is large, even more than twice that of the green light emitting unit G, and the driving current of the green light emitting unit G is greater than that of the blue light emitting unit B, in the array substrate 1 in some embodiments of the present disclosure, the driving circuits with different voltages are used to drive the red light emitting unit R, the green light emitting unit G, and the blue light emitting unit B, respectively, which is able to reduce the power consumption of the array substrate 1 to a great extent. Moreover, since the width to length ratio of the second driving transistor T12 for driving the green light emitting unit G is greater than that of the third driving transistor T13 for driving the blue light emitting unit B, the adjustment range of the data signal of the blue light emitting unit B may be further increased, which reduces the manufacturing difficulty of the driving chip, and thus is beneficial for the display device to realize display of more gray scales.

In some examples, as shown in FIG. 10, the first driving circuit 111 further includes the first switching transistor T21, the second driving circuit 112 further includes the second switching transistor T22, and the third driving circuit 113 further includes a third switching transistor T23. The width to length ratio of the first switching transistor T21 is greater than that of the second switching transistor T22, and the width to length ratio of the second switching transistor T22 is greater than that of the third switching transistor T23.

In some examples, the width to length ratio of the first switching transistor T21 may be the same as that of the first driving transistor T11, the width to length ratio of the second switching transistor T22 may be the same as that of the second driving transistor T12, and the width to length ratio of the third switching transistor T23 may be the same as that of the third driving transistor T13, which may reduce the manufacturing difficulty of the array substrate 1.

In some examples, as shown in FIG. 10, the first driving circuit 111 further includes the first storage capacitor C1 and the first data writing transistor T31, the second driving circuit 112 further includes the second storage capacitor C2 and the second data writing transistor T32, and the third driving circuit 113 further includes a third storage capacitor C3 and a third data writing transistor T33. The first storage capacitor C1, the second storage capacitor C2, and the third storage capacitor C3 may have a same size. Alternatively, the sizes of the first storage capacitor C1, the second storage capacitor C2, and the third storage capacitor C3 may be adjusted according to the design of the entire driving circuit. The first data writing transistor T31, the second data writing transistor T32, and the third data writing transistor T33 may have a same width to length ratio to facilitate the adjustment of the data signal by the driving chip.

For example, specific circuits of the first driving circuit 111, the second driving circuit 112, and the third driving circuit 113 may be adjusted according to implementation conditions.

Figure 11:
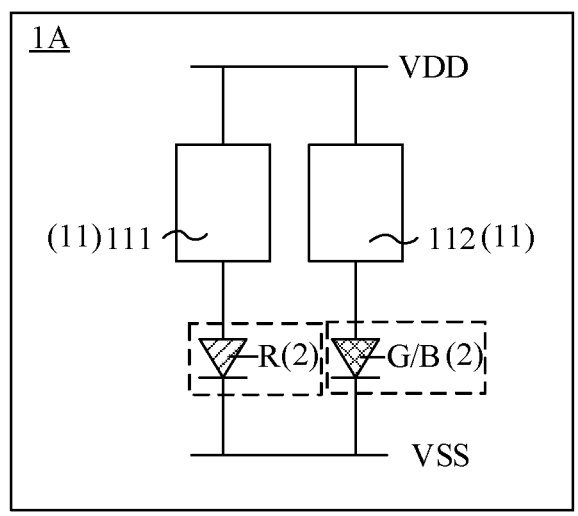
FIG. 11 is a structural diagram of yet another array substrate according to some embodiments.

In addition, some embodiments of the present disclosure provide another array substrate 1A. As shown in FIG. 11, the array substrate 1A is configured to be capable of carrying a plurality of light emitting units 2 with different light emitting colors. The array substrate 1A includes a plurality of pixel driving circuits 11. The plurality of pixel driving circuits 11 include at least one first driving circuit 111 and at least one second driving circuit 112. The first driving circuit 111 and the second driving circuit 112 are configured to drive light emitting units 2 with different light emitting colors, respectively. The first driving circuit 111 includes a first driving transistor, and the second driving circuit includes a second driving transistor. A width to length ratio of the first driving transistor is greater than that of the second driving transistor.

Figure 12:
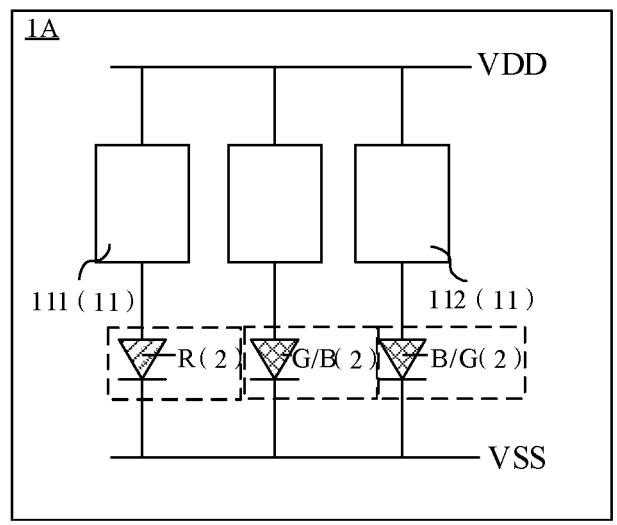
FIG. 12 is a structural diagram of yet another array substrate according to some embodiments.

In some examples, as shown in FIG. 12, the light emitting units 2 include a red light emitting unit R, a green light emitting unit G, and a blue light emitting unit B. The first driving circuit 111 is configured to drive the red light emitting unit R, and the second driving circuit 112 is configured to drive the green light emitting unit G or the blue light emitting unit B.

The μLED chip is the current driven device, and a driving current of the green light emitting unit G (or the blue light emitting unit B) is less than that of the red light emitting unit R. It can be seen from the above that the adjustment range of the data signal of the driving transistor corresponding to the green light emitting unit G (or the blue light emitting unit B) is relatively small. In this way, the luminance adjustment fineness of the green light emitting unit G (or the blue light emitting unit B) is relatively large, and the adjustment difficulty is relatively high. However, in a case where the width to length ratio of the second driving transistor for driving the green light emitting unit G (or the blue light emitting unit B) is less than that of the first driving transistor for driving the red light emitting unit R, the adjustment range of $V_{data}$ of the green light emitting unit G (or the blue light emitting unit B) is increased. In this way, the luminance adjustment fineness of the green light emitting unit G (or the blue light emitting unit B) is reduced, which therefore reduces the manufacturing difficulty of the driving chip, and is further beneficial for the display device to realize display of more gray scales.

In addition, as shown in FIG. 8, the right side of FIG. 8 further shows a layout design in the case where the sizes of the driving transistors corresponding to each pixel unit Pixel-A (e.g., including the red light emitting unit R, the green light emitting unit G and the blue light emitting unit B) in the array substrate 1A in some embodiments of the present disclosure are different. It can be seen from the above that since the driving transistor corresponding to the green light emitting unit G (or the blue light emitting unit B) with a small driving current has a small width to length ratio, in the array substrate 1A in some embodiments of the present disclosure, the width to length ratio of the second driving transistor is less than that of the first driving transistor, which is able to reduce a pixel layout design space required by each pixel unit Pixel-A, and thus is beneficial to improve the resolution of the product.

It will be noted that the first driving transistor and the second driving transistor in the array substrate 1A may be specifically designed with reference to the first driving transistor T11 and the second driving transistor T12 in the array substrate 1 described above, and have beneficial effects that are also consistent with the beneficial effects of the array substrate 1 provided with the first driving transistor T11 and the second driving transistor T12 therein, which will not be repeated here.

Figure 13:
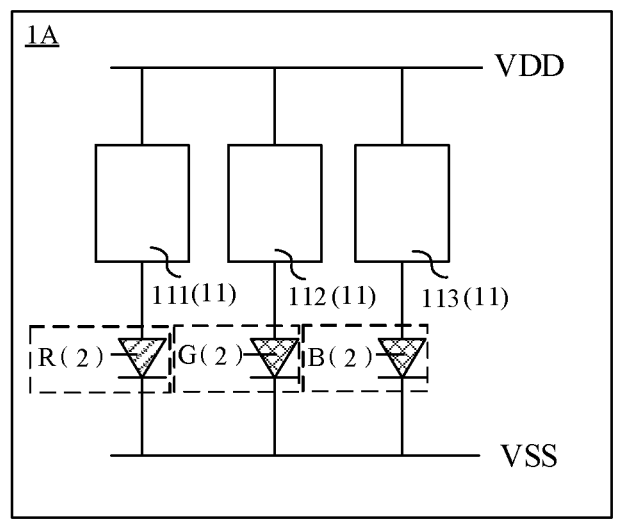
FIG. 13 is a structural diagram of yet another array substrate according to some embodiments.

In some embodiments, as shown in FIG. 13, the plurality of pixel driving circuits 11 include at least one third driving circuit 113. The second driving circuit 112 is configured to drive the green light emitting unit G, and the third driving circuit 113 is configured to drive the blue light emitting unit B. As shown in FIG. 10, the third driving circuit 113 further includes a third driving transistor T13, and the width to length ratio of the second driving transistor T12 is greater than that of the third driving transistor T13. In this case, since a maximum driving current of the blue light emitting unit B is less than that of the green light emitting unit G, this arrangement may further increase the adjustment range of the data signal of the blue light emitting unit B, which reduces the manufacturing difficulty of the driving chip, and is beneficial for the display device to realize display of more gray scales. Moreover, the pixel layout design space required by each pixel unit may also be reduced, which is beneficial to improve the resolution of the product.

It will be noted that the first driving circuit 111 may further include a switching transistor, a storage capacitor, a data writing transistor, and the like, and the second driving circuit 112 and the first driving circuit 111 have a same structure. Width to length ratios of the switching transistor and the data writing transistor and a size of the storage capacitor may be set with reference to the above, and beneficial effects thereof are also consistent with the above, which will not be repeated here.

Figure 14:
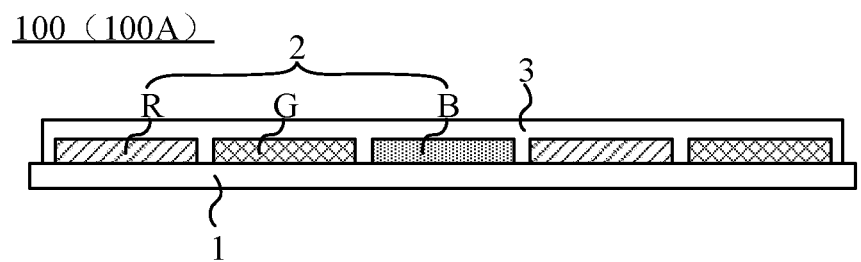
FIG. 14 is a structural diagram of a display panel according to some embodiments.

Some embodiments of the present disclosure provide a display panel 100. As shown in FIG. 14, the display panel 100 includes the array substrate 1 and the light emitting units 2 in some of the above embodiments, and has the beneficial effects of the array substrate 1 in some of the above embodiments, which will not be repeated here.

In some embodiments, the display panel 100 further includes an encapsulation structure 3 configured to encapsulate the light emitting units 2 on the array substrate 1 to protect the light emitting units 2 and circuits on the array substrate 1.

Some embodiments of the present disclosure provide another display panel 100A. As shown in FIG. 14, the display panel 100 includes the array substrate 1A and the light emitting units 2 in some of the above embodiments, and has the beneficial effects of the array substrate 1A in some of the above embodiments, which will not be repeated here.

In some embodiments, the display panel 100A further includes an encapsulation structure 3 configured to encapsulate the light emitting units 2 on the array substrate 1A to protect the light emitting units 2 and circuits on the array substrate 1A.

Figure 15:
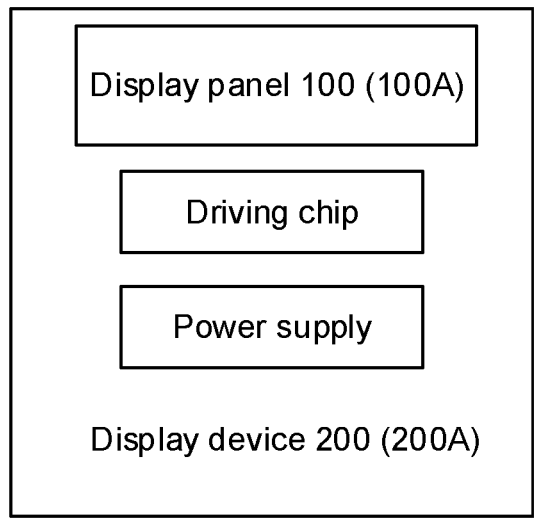
FIG. 15 is a block diagram of a display device according to some embodiments.

Some embodiments of the present disclosure provide a display device 200. As shown in FIG. 15, the display device 200 includes the display panel 100 in some of the above embodiments, and has the beneficial effects of the display panel 100 in some of the above embodiments, which will not be repeated here.

In some examples, the display device 200 further includes a driving chip and a power supply. The driving chip is configured to drive the display panel 100 to perform displaying, and the power supply is configured to supply power to the display panel 100.

Some embodiments of the present disclosure provide another display device 200A. As shown in FIG. 15, the display device 200A includes the display panel 100A in some of the above embodiments, and has the beneficial effects of the display panel 100A in some of the above embodiments, which will not be repeated here.

In some examples, the display device 200A further includes a driving chip and a power supply. The driving chip is configured to drive the display panel 100A to perform displaying, and the power supply is configured to supply power to the display panel 100A.

Figure 16:
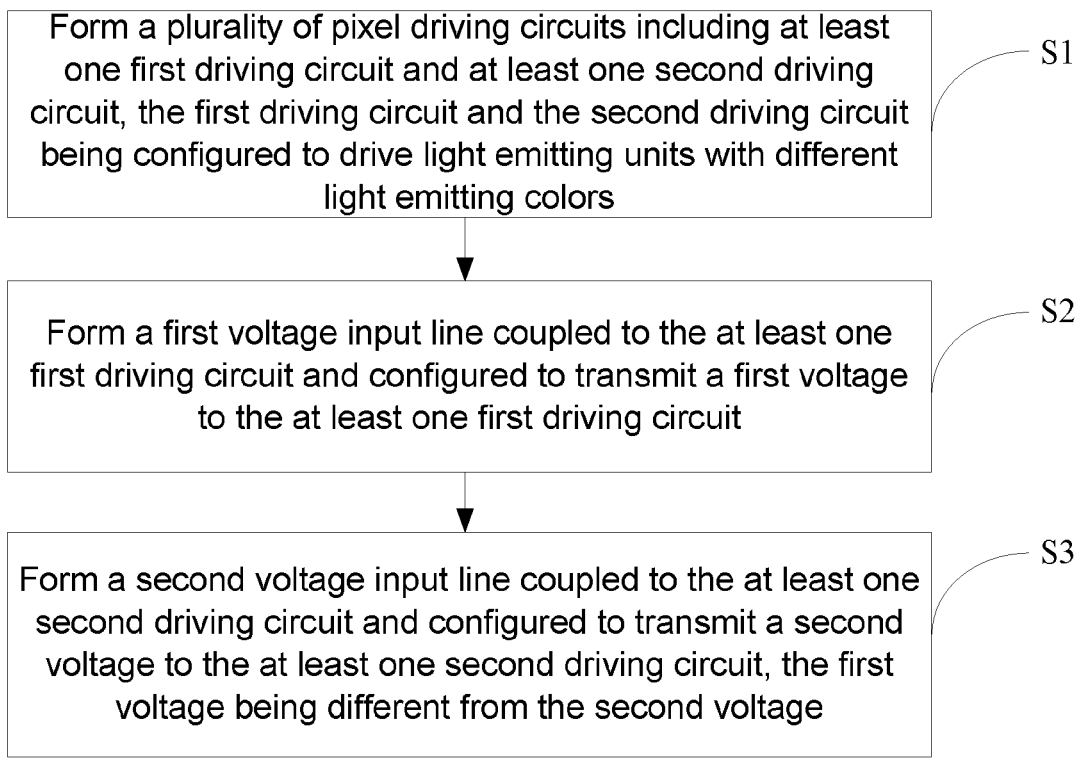
FIG. 16 is a flow diagram of a manufacturing method of an array substrate according to some embodiments.

Some embodiments of the present disclosure provide a manufacturing method of an array substrate 1, and as shown in FIGS. 3 and 16, the manufacturing method includes S1 to S3.

In S1, a plurality of pixel driving circuits 11 are formed. The plurality of pixel driving circuits 11 include at least one first driving circuit 111 and at least one second driving circuit 112. The first driving circuit 111 and the second driving circuit 112 are configured to drive light emitting units 2 with different light emitting colors.

Each light emitting unit 2 has a first electrode and a second electrode, and the first driving circuit 111 and the second driving circuit 112 are respectively coupled to the first electrodes of the light emitting units 2 with different light emitting colors.

In S2, a first voltage input line 121 is formed. The first voltage input line 121 is coupled to the at least one first driving circuit 111, and is configured to transmit a first voltage V1 to the at least one first driving circuit 111.

In S3, a second voltage input line 122 is formed. The second voltage input line 122 is coupled to the at least one second driving circuit 112, and is configured to transmit a second voltage V2 to the at least one second driving circuit 112. The first voltage V1 is different from the second voltage V2.

On this basis, a common voltage input line 13 may further be formed on the array substrate 1. The common voltage input line 13 is coupled to the second electrodes of the plurality of light emitting units 2 with different light emitting colors, and is configured to transmit a set voltage V0 to the second electrodes of the plurality of light emitting units 2 with different light emitting colors.

Through the manufacturing method of the array substrate 1 in some embodiments of the present disclosure, the array substrate 1 in any one of the above embodiments may be manufactured. In the array substrate 1, a voltage, provided by the first voltage input line 121 and the common voltage input line 13, across both the first driving circuit 111 and the light emitting unit 2 corresponding to the first driving circuit 111 is different from a voltage, provided by the second voltage input line 122 and the common voltage input line 13, across both the second driving circuit 112 and the light emitting unit 2 corresponding to the second driving circuit 112. Therefore, different voltages are able to be provided according to requirements for driving the light emitting units 2 with different light emitting colors, so that the light emitting unit 2 which requires a small driving current and the pixel driving circuit 11 corresponding thereto may overall obtain a small voltage. Also, in the case of realizing the white balance, the light emitting unit 2 with a small driving current has an unchanged driving current, and a voltage across the pixel driving circuit 11 corresponding to the light emitting unit 2 is consistent with an actual voltage required. Therefore, an ineffective power consumption of a non-luminous portion in the pixel driving circuit 11 may be reduced, thereby reducing the power consumption of the array substrate 1.

Some embodiments of the present disclosure further provide a manufacturing method of an array substrate 1A. As shown in FIG. 17, the manufacturing method includes S11.

In S11, as shown in FIG. 11, a plurality of pixel driving circuits 11 are formed. The plurality of pixel driving circuits 11 include at least one first driving circuit 111 and at least one second driving circuit 112. The first driving circuit 111 and the second driving circuit 112 are configured to be capable of driving light emitting units 2 with different light emitting colors. The first driving circuit 111 includes a first driving transistor, and the second driving circuit includes a second driving transistor. A width to length ratio of the first driving transistor is greater than that of the second driving transistor.

For example, the light emitting unit 2 includes a red light emitting unit R, a green light emitting unit G, and a blue light emitting unit B. The first driving circuit 111 is configured to drive the red light emitting unit R, and the second driving circuit 112 is configured to drive the green light emitting unit G or the blue light emitting unit B.

Through the manufacturing method of the array substrate 1A in some embodiments of the present disclosure, the array substrate 1A in any one of the above embodiments may be manufactured. In the array substrate 1A, since the width to length ratio of the second driving transistor for driving the green light emitting unit G (or the blue light emitting unit B) is less than that of the first driving transistor for driving the red light emitting unit R, an adjustment range of a data signal of the green light emitting unit G (or the blue light emitting unit B) is relatively increased. In this way, a luminance adjustment fineness of the green light emitting unit G (or the blue light emitting unit B) may be reduced, which reduces the manufacturing difficulty of the driving chip, and is beneficial for the display device to realize display of more gray scales. In addition, since the width to length ratio of the second driving transistor is less than that of the first driving transistor, a pixel layout design space required by each pixel unit may also be reduced, which is beneficial to improve the resolution of the product.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate configured to carry a plurality of light emitting units with different light emitting colors, the array substrate comprising:
   a plurality of pixel driving circuits including at least one first driving circuit and at least one second driving circuit, a first driving circuit in the at least one first driving circuit and two second driving circuits in the at least one second driving circuit being configured to drive light emitting units with different light emitting colors, respectively, wherein each light emitting unit has a first electrode and a second electrode, and the first driving circuit and the two second driving circuits are respectively coupled to first electrodes of the light emitting units with the different light emitting colors;
   a first voltage input line coupled to the at least one first driving circuit and configured to transmit a first voltage to the at least one first driving circuit;
   a second voltage input line coupled to the at least one second driving circuit and configured to transmit a second voltage to the at least one second driving circuit, the first voltage being different from the second voltage; and
   a common voltage input line coupled to second electrodes of the plurality of light emitting units with the different light emitting colors and configured to transmit a set voltage to the second electrodes of the plurality of light emitting units with the different light emitting colors;
   wherein the plurality of light emitting units include at least one red light emitting unit, at least one green light emitting unit and at least one blue light emitting unit;
   the first driving circuit is configured to drive a red light emitting unit in the at least one red light emitting unit, one second driving circuit of the two second driving circuits is configured to drive a green light emitting unit in the at least one green light emitting unit, and another second driving circuit of the two second driving circuits is configured to a blue light emitting unit in the at least one blue light emitting unit; and
   a voltage difference between the first voltage and the set voltage is greater than a voltage difference between the second voltage and the set voltage.

2. The array substrate according to claim 1, wherein
   the first driving circuit includes a first driving transistor, and each second driving circuit of the two second driving circuits includes a second driving transistor;
   a width to length ratio of the first driving transistor is greater than a width to length ratio of the second driving transistor.

3. The array substrate according to claim 2, wherein
   the first driving circuit further includes a first switching transistor, and the second driving circuit further includes a second switching transistor;
   a width to length ratio of the first switching transistor is greater than a width to length ratio of the second switching transistor.

4. The array substrate according to claim 1, wherein the plurality of pixel driving circuits further include at least one third driving circuit; the array substrate further comprises:
   a third voltage input line coupled to the at least one third driving circuit and configured to transmit a third voltage to the at least one third driving circuit, the third voltage being different from both the first voltage and the second voltage.

5. The array substrate according to claim 4, wherein
   the first driving circuit includes a first driving transistor, the second driving circuit includes a second driving transistor, and the third driving circuit includes a third driving transistor;
   a width to length ratio of the first driving transistor is greater than a width to length ratio of the second driving transistor, and the width to length ratio of the second driving transistor is greater than a width to length ratio of the third driving transistor.

6. The array substrate according to claim 5, wherein
   the first driving circuit further includes a first switching transistor, the second driving circuit further includes a second switching transistor, and the third driving circuit further includes a third switching transistor;
   a width to length ratio of the first switching transistor is greater than a width to length ratio of the second switching transistor, and the width to length ratio of the second switching transistor is greater than a width to length ratio of the third switching transistor.

7. The array substrate according to claim 1, wherein
   a light emitting unit in the plurality of light emitting units is a micro light emitting diode or a sub-millimeter light emitting diode.

8. A display panel, comprising:
   the array substrate according to claim 1; and
   the plurality of light emitting units with different light emitting colors disposed on the array substrate.

9. A display device, comprising the display panel according to claim 8.

10. An array substrate configured to carry a plurality of light emitting units with different light emitting colors, the array substrate comprising:
    a plurality of pixel driving circuits including at least one first driving circuit, at least one second driving circuit and at least one third driving circuit, a first driving circuit in the at least one first driving circuit and a second driving circuit in the at least one second driving circuit being configured to drive light emitting units with different light emitting colors, respectively, wherein each light emitting unit has a first electrode and a second electrode, and the first driving circuit and the second driving circuit are respectively coupled to first electrodes of the light emitting units with the different light emitting colors;
    a first voltage input line coupled to the at least one first driving circuit and configured to transmit a first voltage to the at least one first driving circuit;
    a second voltage input line coupled to the at least one second driving circuit and configured to transmit a second voltage to the at least one second driving circuit, the first voltage being different from the second voltage;
    a common voltage input line coupled to second electrodes of the plurality of light emitting units with the different light emitting colors and configured to transmit a set voltage to the second electrodes of the plurality of light emitting units with the different light emitting colors; and
    a third voltage input line coupled to the at least one third driving circuit and configured to transmit a third voltage to the at least one third driving circuit, the third voltage being different from both the first voltage and the second voltage, wherein
    the plurality of light emitting units include at least one red light emitting unit, at least one green light emitting unit and at least one blue light emitting unit;

the first driving circuit is coupled to a first electrode of a red light emitting unit in the at least one red light emitting unit, and is configured to drive the red light emitting unit; the second driving circuit is coupled to a first electrode of a green light emitting unit in the at least one green light emitting unit, and is configured to drive the green light emitting unit; and the third driving circuit is coupled to a first electrode of a blue light emitting unit in the at least one blue light emitting unit, and is configured to drive the blue light emitting unit; and a voltage difference between the first voltage and the set voltage is greater than a voltage difference between the second voltage and the set voltage, and the voltage difference between the second voltage and the set voltage is greater than a voltage difference between the third voltage and the set voltage.

11. The array substrate according to claim 10, wherein the first driving circuit includes a first driving transistor, the second driving circuit includes a second driving transistor, and the third driving circuit includes a third driving transistor;

a width to length ratio of the first driving transistor is greater than a width to length ratio of the second driving transistor, and the width to length ratio of the second driving transistor is greater than a width to length ratio of the third driving transistor.

12. The array substrate according to claim 11, wherein the first driving circuit further includes a first switching transistor, the second driving circuit further includes a second switching transistor, and the third driving circuit further includes a third switching transistor;

a width to length ratio of the first switching transistor is greater than a width to length ratio of the second switching transistor, and the width to length ratio of the second switching transistor is greater than a width to length ratio of the third switching transistor.

13. The array substrate according to claim 10, wherein a light emitting unit in the plurality of light emitting units is a micro light emitting diode or a sub-millimeter light emitting diode.

14. A display panel, comprising:
the array substrate according to claim 7; and
the plurality of light emitting units with different light emitting colors disposed on the array substrate.

15. A display device, comprising the display panel according to claim 14.

16. A manufacturing method of an array substrate, the method comprising:
forming a plurality of pixel driving circuits including at least one first driving circuit and at least one second driving circuit, a first driving circuit in the at least one first driving circuit and two second driving circuits in the at least one second driving circuit being configured to drive light emitting units with different light emitting colors, wherein each light emitting unit has a first electrode and a second electrode, and the first driving circuit and the two second driving circuits are respectively coupled to first electrodes of the light emitting units with the different light emitting colors;

forming a first voltage input line coupled to the at least one first driving circuit and configured to transmit a first voltage to the at least one first driving circuit; and forming a second voltage input line coupled to the at least one second driving circuit and configured to transmit a second voltage to the at least one second driving circuit, wherein the first voltage is different from the second voltage;

forming a common voltage input line coupled to second electrodes of the plurality of light emitting units with the different light emitting colors and configured to transmit a set voltage to the second electrodes of the plurality of light emitting units with the different light emitting colors;

wherein the plurality of light emitting units include at least one red light emitting unit, at least one green light emitting unit and at least one blue light emitting unit;

the first driving circuit is configured to drive a red light emitting unit in the at least one red light emitting unit, one second driving circuit of the two second driving circuits is configured to drive a green light emitting unit in the at least one green light emitting unit, and another second driving circuit of the two second driving circuits is configured to drive a blue light emitting unit in the at least one blue light emitting unit; and a voltage difference between the first voltage and the set voltage is greater than a voltage difference between the second voltage and the set voltage.

* * * * *